(12) United States Patent  
Kim

(10) Patent No.: US 9,682,400 B2
(45) Date of Patent: Jun. 20, 2017

(54) MASK FRAME ASSEMBLY FOR THIN FILM DEPOSITION AND MANUFACTURING METHOD THEREOF

(71) Applicant: Samsung Display Co., Ltd., Yongin, Gyeonggi-Do (KR)

(72) Inventor: Jun Young Kim, Asan-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 170 days.

(21) Appl. No.: 14/522,542

(22) Filed: Oct. 23, 2014

(65) Prior Publication Data

US 2015/0114287 A1 Apr. 30, 2015

(30) Foreign Application Priority Data

Oct. 25, 2013 (KR) .......................... 10-2013-0128078

(51) Int. Cl.
*B05C 21/00* (2006.01)
*H01L 51/56* (2006.01)
*C23C 14/04* (2006.01)
*H01L 51/00* (2006.01)

(52) U.S. Cl.
CPC .......... *B05C 21/005* (2013.01); *C23C 14/042* (2013.01); *H01L 51/0011* (2013.01); *H01L 51/56* (2013.01); *Y10T 29/49826* (2015.01)

(58) Field of Classification Search
None
See application file for complete search history.

(56) References Cited

U.S. PATENT DOCUMENTS

2002/0043920 A1* 4/2002 Kim ...................... H01J 29/076
313/407
2003/0221614 A1* 12/2003 Kang .................... C23C 14/042
118/504

FOREIGN PATENT DOCUMENTS

| KR | 10-0752379 B1 | 8/2007 |
| KR | 10-0908232 B1 | 7/2009 |
| KR | 10-2012-0066493 A | 6/2012 |
| KR | 10-1182440 B1 | 9/2012 |

* cited by examiner

*Primary Examiner* — Dah-Wei D Yuan
*Assistant Examiner* — Jethro M Pence
(74) *Attorney, Agent, or Firm* — Knobbe, Martens, Olson & Bear, LLP

(57) ABSTRACT

A mask frame assembly for thin film deposition and manufacturing method thereof are disclosed. One inventive aspect includes a mask frame, a plurality of first masks and a plurality of second masks. The first and second masks are alternately formed in a first direction. Two overlapped portions of each of the first and second masks are connected to both sides of the non-overlapped portion of each of the first and second mask, respectively. In addition, one overlapped portion of each first mask and one overlapped portion of each second mask overlap each other at a connection area.

10 Claims, 6 Drawing Sheets

MASK FRAME ASSEMBLY FOR THIN FILM DEPOSITION AND MANUFACTURING METHOD THEREOF

CROSS-REFERENCE TO RELATED APPLICATIONS

This application claims priority to and the benefit of Korean Patent Application No. 10-2013-0128078 filed in the Korean Intellectual Property Office on Oct. 25, 2013, the entire contents of which are incorporated herein by reference.

BACKGROUND

Field

The disclosed technology relates to a mask frame assembly for thin film deposition and manufacturing method thereof with stabilized masks and connections.

Description of the Related Technology

As an active light emitting display element, an organic light emitting element, e.g., organic light emitting diode (OLED), is known to have a wide viewing angle, excellent contrast and a high response speed. As such, it has received much public attention as a next-generation display element.

Each organic light emitting element has an organic light emitting layer and an electrode layer is deposited on it. Typically, the organic light emitting layer and the electrode layer are deposited in pixel areas by using a thin film deposition mask. With that said, as the size of a display using these elements increases, more and more deposition masks will be used to connect to each other and are held together by a frame building block.

However, when thin film deposition masks connect to each other and as the length of each rectangular mask increases, the individual masks will droop and become spaced apart with time.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

The disclosed technology provides provide a mask frame assembly for thin film deposition used in a large-size display device so that individual masks do not droop or connectors are not spaced apart from each other.

One inventive aspect of the disclosed technology provides a mask frame assembly for thin film deposition. The aspect includes: a first mask and a second mask alternately placed in a first direction and connected to each other, and a connector, and the first mask includes a first non-overlapped portion, and a first overlapped portion and a second overlapped portion connected to both sides of the first non-overlapped portion, the second mask includes a second non-overlapped portion, and a third overlapped portion and a fourth overlapped portion connected to both sides of the first non-overlapped portion, and the first overlapped portion of the first mask and the fourth overlapped portion of the second mask overlap with each other at the connector.

A plurality of first openings can be formed at the first overlapped portion, a plurality of second openings can be formed at the fourth overlapped portion, and the first openings and the second openings can overlap with each other at the connector.

The width of the connector measured in the first direction can be greater than the width of each of the first openings and the second openings measured in the first direction.

The second overlapped portion of the first mask and the third overlapped portion of the second mask can overlap with each other at the connector.

The connector can be extended in a second direction that is vertical to the first direction.

The mask frame assembly for thin film deposition can further include: a first edge portion formed at a first edge in the first direction, and a second edge portion formed at a second edge facing the first edge in the first direction, and the first edge portion and the second edge portion include an overlapped portion formed at one edge and having the same thickness as the first to fourth overlapped portions.

The connector can include an overlapping area where the first overlapped portion of the first mask and the fourth overlapped portion of the second mask overlap with each other and a non-overlapping area where the first overlapped portion of the first mask and the fourth overlapped portion of the second mask do not overlap with each other.

The overlapping area and the non-overlapping area of the connector can be placed alternately to each other in the second direction that is vertical to the first direction.

A plurality of first openings can be formed at the first overlapped portion, a plurality of second openings can be formed at the fourth overlapped portion, and the first openings and the second openings can overlap with each other at the overlapped portion of the connector.

The width of the overlapped portion of the connector measured in the first direction can be greater than the width of each of the first openings and the second openings measured in the first direction.

Another inventive aspect of the disclosed technology provides a method of assembling a mask frame assembly for thin film deposition. The method comprises alternatively forming at least one first mask and at least one second mask in a first direction and forming at least one first connector. The first mask includes first and second overlapped portions and the second mask includes third and fourth overlapped portion. In addition, the first overlapped portion of the adjacent first and second masks and the fourth overlapped portion of the adjacent first and second masks overlap each other at the first connector.

According to exemplary embodiments of the disclosed technology, it is possible to provide a large-size mask frame assembly for thin film deposition used in a large-size display device in which individual masks connected to each other do not droop or connectors are not spaced apart from each other.

DETAILED DESCRIPTION OF CERTAIN INVENTIVE EMBODIMENTS

Figure 1:
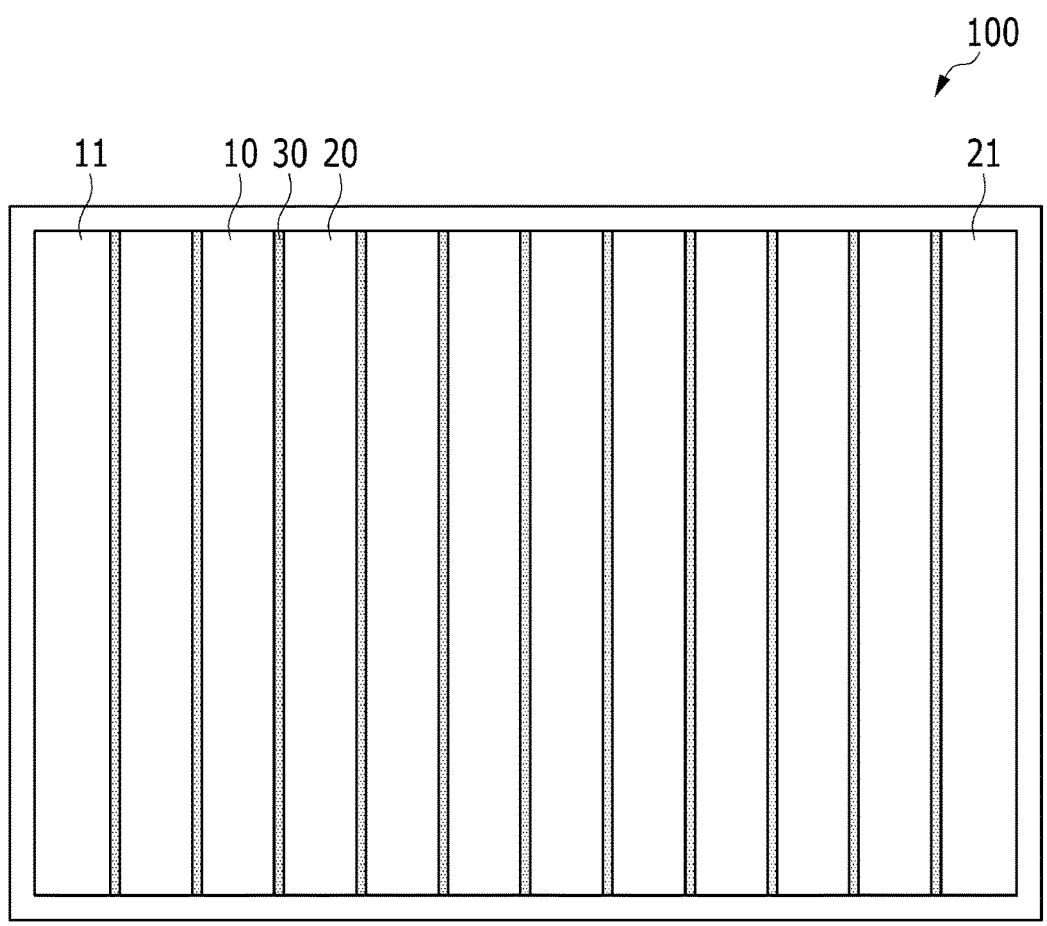
FIG. 1 is a layout view of a mask frame assembly for thin film deposition according to an exemplary embodiment of the disclosed technology.

The disclosed technology will be described more fully hereinafter with reference to the accompanying drawings, in which exemplary embodiments of the invention are shown. As those skilled in the art would realize, the described embodiments may be modified in various different ways, all without departing from the spirit or scope of the disclosed technology.

In the following description, technical terms are used only to explain a specific exemplary embodiment while not limiting the disclosed technology. The terms of a singular form may include plural forms unless referred to the contrary. The terms "include," "comprise," "including," and "comprising," as used herein, specify a component, a process, an operation, and/or an element but do not exclude other components, processes, operations, and/or elements. It will be understood that although the terms "first" and "second" are used herein to describe various elements, these elements should not be limited by these terms. These terms are only used to distinguish one component from other components.

It will be understood that when a layer, region, or component is referred to as being "formed on," another layer, region, or component, it can be directly or indirectly formed on the other layer, region, or component. That is, for example, intervening layers, regions, or components may be present.

The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the disclosed technology is not limited to the illustrated sizes and thicknesses.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it is directly on the other element or intervening elements may also be present.

Throughout this specification and the claims that follow, when it is described that an element is "connected" to another element, the element is "directly connected" to the other element or "electrically connected" to the other element through a third element. In addition, unless explicitly described to the contrary, the word "comprise" and variations such as "comprises" or "comprising" will be understood to imply the inclusion of stated elements but not the exclusion of any other elements. Throughout this specification, it is understood that the term "on" and similar terms are used generally and are not necessarily related to a gravitational reference.

Here, when a first element is described as being connected to a second element, the first element is not only directly connected to the second element but may also be indirectly connected to the second element via a third element. Further, some of the elements that are not essential to the complete understanding of the disclosed technology are omitted for clarity. Also, like reference numerals refer to like elements throughout.

First, referring to FIG. 1, a mask frame assembly for thin film deposition according to an exemplary embodiment of the disclosed technology will be described. FIG. 1 is a layout view of a mask frame assembly for thin film deposition according to an exemplary embodiment of the disclosed technology.

Referring to FIG. 1 and according to an exemplary embodiment, a mask frame assembly 100 for thin film deposition includes a first mask 10, a second mask 20, a first connection area 30, a first edge 11 and a second edge 21. The first mask 10 and the second mask 20 are alternately placed in a first direction X1 and connect to each other. In some exemplary implementations, a portion of the first mask 10 and a portion of the second mask 20 connect to each other in the first connection area 30.

Although not illustrated, a plurality of openings is formed on the first mask 10 and the second mask 20. An organic light emitting layer and an electrode layer of an organic light emitting element are deposited through the openings.

A first part of the first mask 10 and a second part of the second mask 20 overlap with each other at the first connection area 30. The first connection area 30 is extended in a second direction Y1 that is vertical to the first direction X1.

The first edge 11 and the second edge 21 are formed at both ends of the mask frame assembly 100 for thin film deposition in the first direction X1, respectively. The first edge 11 is formed at a first end of the mask frame assembly 100 for thin film deposition. The second edge 21 is formed at a second end facing the first end in the first direction X1.

Figure 2:
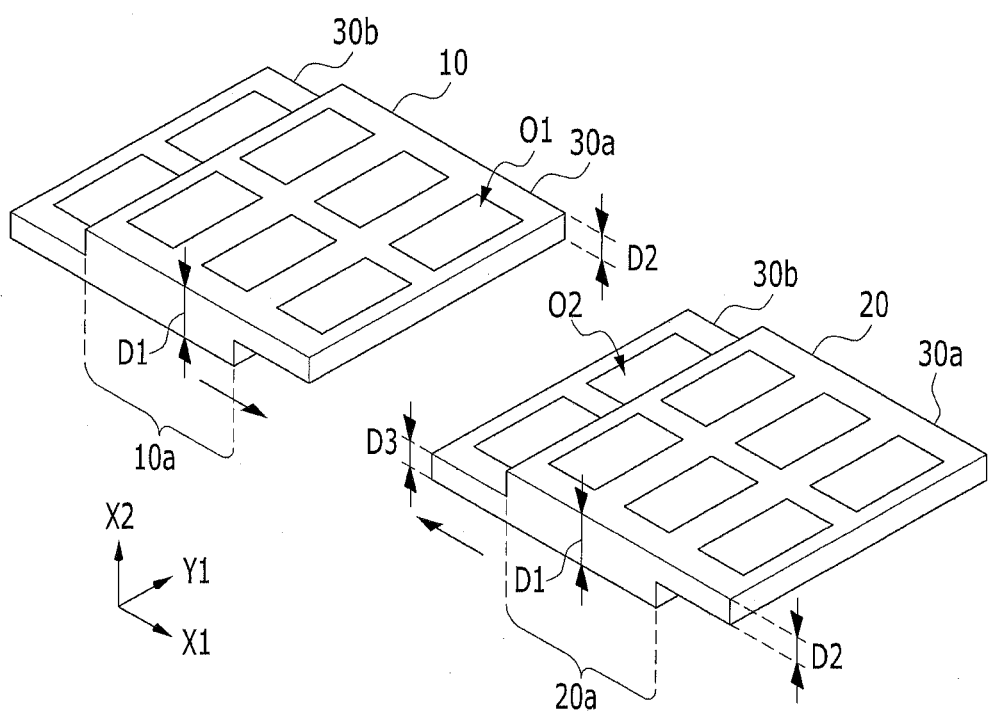
FIG. 2 is a diagram illustrating a part and an assembly method of the mask frame assembly for thin film deposition of FIG. 1.

Then, referring to FIG. 2, structures of the first mask 10 and the second mask 20 of the mask frame assembly 100 for thin film deposition according to the exemplary embodiment of the disclosed technology will be described in detail. FIG. 2 is a diagram illustrating portions and an assembly method of the mask frame assembly for thin film deposition of FIG. 1.

Referring to FIG. 2, the first mask 10 includes a first non-overlapped portion 10a having a first thickness D1, a first overlapped portion 30a, and a second overlapped portion 30b having a third thickness. The first overlapped portion 30a connects to the first non-overlapped portion 10a and has a second thickness D2. The second thickness D2 is less than the first thickness D1 of the first non-overlapped portion 10a.

The second overlapped portion 30b, the first non-overlapped portion 10a, and the first overlapped portion 30a of the first mask 10 are sequentially formed in the first direction X1.

The first overlapped portion 30a of the first mask 10 has the same height of a top surface as the first non-overlapped portion 10a of the first mask 10. That is, the first overlapped portion 30a of the first mask 10 has a shape in which a portion of lower portion of the first mask 10 is removed.

Unlike this, the second overlapped portion 30b of the first mask 10 has the same height of a bottom surface as the first non-overlapped portion 10a of the first mask 10. That is, the second overlapped portion 30b of the first mask 10 has a shape in which a portion of upper portion of the first mask 10 is removed.

Each of the second thickness D2 of the first overlapped portion 30a and the third thickness D3 of the second overlapped portion 30b is less than the first thickness D1 of the first non-overlapped portion 10a. A sum of the second thickness D2 of the first overlapped portion 30a and the third thickness D3 of the second overlapped portion 30b may be substantially equal to the first thickness D1 of the first non-overlapped portion 10a. In one exemplary implementation, each of the second thickness D2 of the first overlapped portion 30a and the third thickness D3 of the second overlapped portion 30b is approximately one half of the first thickness D1 of the first non-overlapped portion 10a. The second thickness D2 of the first overlapped portion 30a and the third thickness D3 of the second overlapped portion 30b may be substantially equal to or different from each other.

The second mask 20 includes a second non-overlapped portion 20a having the first thickness D1, a first overlapped portion 30a and a second overlapped portion 30b. The first overlapped portion 30a connects to the second non-overlapped portion 20a and has the second thickness D2. The second thickness D2 is less than the first thickness D1 of the second non-overlapped portion 20a. The second overlapped portion 30b has the third thickness D3. The third thickness D3 is less than the first thickness D1 of the first non-overlapped portion 10a.

The first overlapped portion 30a, the second non-overlapped portion 20a, and the second overlapped portion 30b of the second mask 20 are sequentially formed in the first direction X1.

The first overlapped portion 30a of the second mask 20 has the same height of a top surface as the second non-overlapped portion 20a of the second mask 20. That is, the first overlapped portion 30a of the second mask 20 has a shape in which a portion of lower portion of the second mask 20 is removed.

Unlike this, the second overlapped portion 30b of the second mask 20 has the same height of a bottom surface as the second non-overlapped portion 20a of the second mask 20. That is, the second overlapped portion 30b of the second mask 20 has a shape in which a portion of upper portion of the second mask 20 is remove.

Each of the second thickness D2 of the first overlapped portion 30a and the third thickness D3 of the second overlapped portion 30b is less than the first thickness D1 of the second non-overlapped portion 20a. A sum of the second thickness D2 of the first overlapped portion 30a and the third thickness D3 of the second overlapped portion 30b may be substantially equal to the first thickness D1 of the second non-overlapped portion 20a. In one exemplary implementation, each of the second thickness D2 of the first overlapped portion 30a and the third thickness D3 of the second overlapped portion 30b is approximately one half of the first thickness D1 of the second non-overlapped portion 20a. The second thickness D2 of the first overlapped portion 30a and the third thickness D3 of the second overlapped portion 30b may be substantially equal to or different from each other.

The first mask 10 and the second mask 20 are placed to be adjacent to each other in the first direction X1 and connect to each other. Referring to FIG. 2, when the first mask 10 and the second mask 20 connect to each other in an arrow direction of FIG. 2, the first overlapped portion 30a of the first mask 10 and the second overlapped portion 30b of the second mask 20 overlap with each other. That is, the first connection area 30 of FIG. 1 is formed by making the first overlapped portion 30a of the first mask 10 and the second overlapped portion 30b of the second mask 20 overlap with each other.

The first overlapped portion 30a and the second overlapped portion 30b are formed to be extended in the second direction Y1 in which the first connection area 30 is extended.

The widths of the first overlapped portion 30a and the second overlapped portion 30b may be greater than the width of an opening O. As a result, the width of the first connection area 30 may also be greater than the width of the opening O.

A plurality of first openings O1 is formed at the first overlapped portion 30a and a plurality of second openings O2 is formed at the second overlapped portion 30b. The first openings O1 of the first overlapped portion 30a and the second openings O2 of the second overlapped portion 30b overlap with each other.

As such, the first connection area 30 of the mask frame assembly for thin film deposition is formed so that the first overlapped portion 30a and the second overlapped portion 30b of the first mask 10 and the second mask 20 connect and overlap with each other. As a result, a mask assembly may not droop depending on a load and the connection area may be prevented from being spaced.

Further, the widths of the first overlapped portion 30a and the second overlapped portion 30b that overlap with each other may be greater than the width of the opening O. As a result, the width of the first connection area 30 may also be greater than the width of the opening O to endure a large load. The width of the first connection area 30 may be changed depending on the load.

The second mask 20 may connect to a left side of the first mask 10. The first mask 10 may connect to a right side of the second mask 20.

Figure 3:
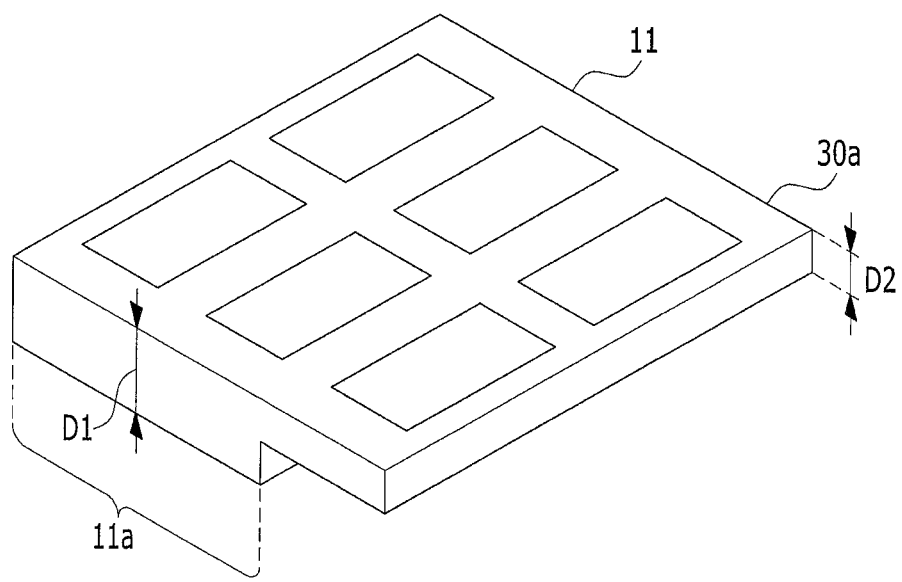
FIGS. 3 and 4 are diagrams illustrating a portion of the mask frame assembly for thin film deposition of FIG. 1.
Figure 4:
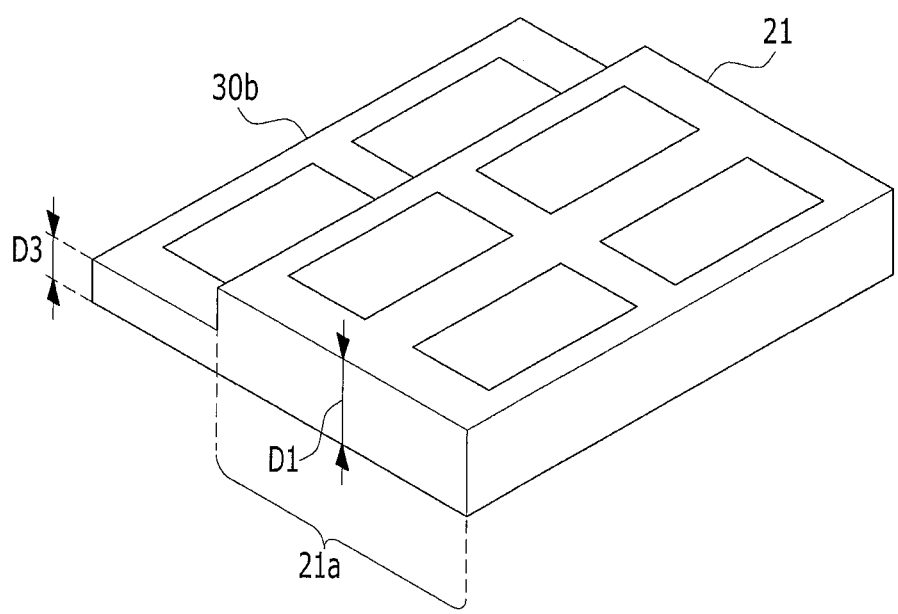

Then, referring to FIGS. 3 and 4, a structure of an edge portion of the mask frame assembly for thin film deposition of FIG. 1 will be described in detail. FIGS. 3 and 4 are diagrams illustrating a portion of the mask frame assembly for thin film deposition of FIG. 1.

Referring to FIGS. 3 and 4, the first edge 11 of the mask frame assembly 100 for thin film deposition includes a third non-overlapped portion 11a and a first overlapped portion 30a. The third non-overlapped portion 11a is formed at an edge of the mask frame assembly 100 for thin film deposition and has the first thickness D1. The first overlapped portion 30a connects to the third non-overlapped portion 11a and has the second thickness D2. The second thickness D2 is less than the first thickness D1.

Similarly thereto, the second edge 21 includes a fourth non-overlapped portion 21a and a second overlapped portion 30b. The fourth non-overlapped portion 21a is formed at the edge of the mask frame assembly 100 for thin film deposition and has the first thickness D1. The second overlapped portion 30b connects to the fourth non-overlapped portion 21a and has the third thickness D3. The third thickness D3 is less than the first thickness D1.

The first overlapped portion 30a of the first edge 11 overlaps the second overlapped portion 30b of an adjacent mask. The first overlapped portion 30a has the first connection area 30. The second overlapped portion 30b of the second edge 21 overlaps the first overlapped portion 30a of the adjacent mask. The second overlapped portion 30b has the first connection area 30.

As such, in the mask frame assembly for thin film deposition according to the exemplary embodiment of the disclosed technology, the connection area 30 connecting the adjacent masks to each other is formed by making two overlapped portions of two adjacent masks overlap with each other. As a result, an influence by the load decreases to prevent the connection area from being spaced and the connection area from drooping by the load.

Figure 5:
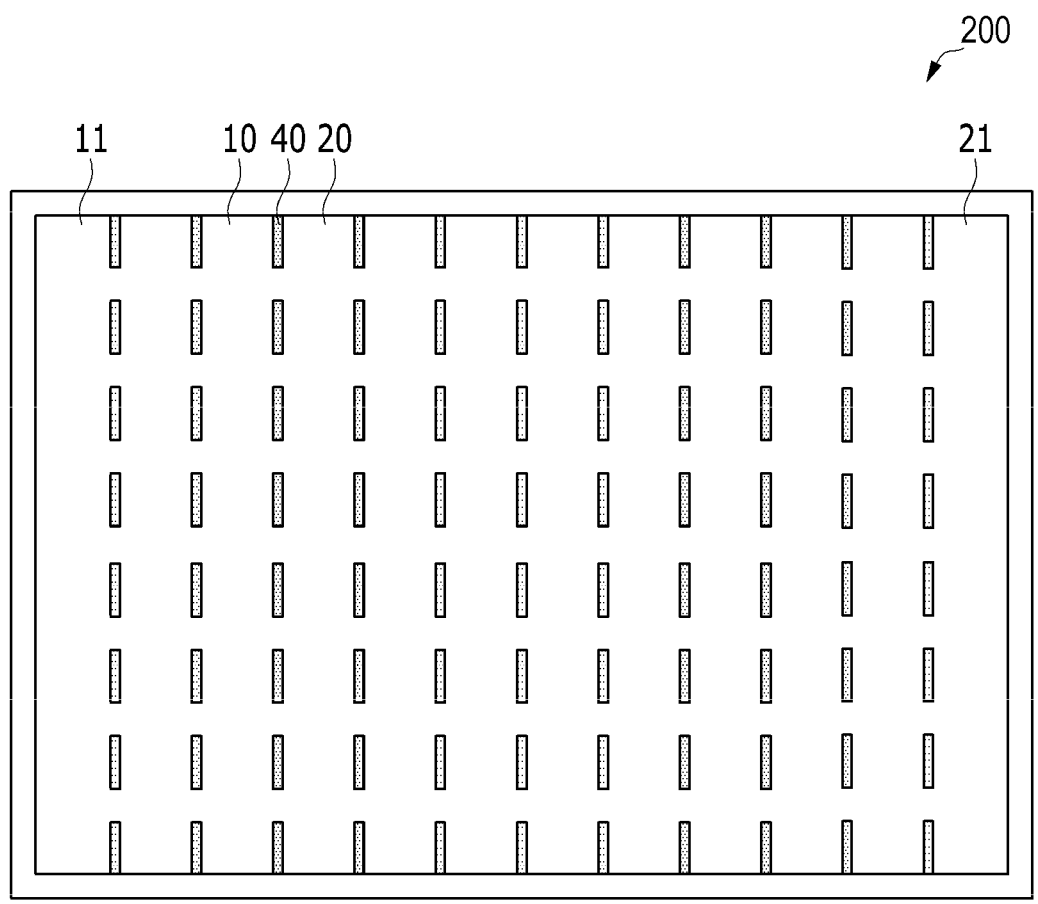
FIG. 5 is a layout view of a mask frame assembly for thin film deposition according to another exemplary embodiment of the disclosed technology.

Then, referring to FIG. 5, a mask frame assembly for thin film deposition according to another exemplary embodiment of the disclosed technology will be described. FIG. 5 is a layout view of a mask frame assembly for thin film deposition according to another exemplary embodiment of the disclosed technology.

Referring to FIG. 5, the mask frame assembly 200 for thin film deposition according to another exemplary embodiment of the disclosed technology includes a first mask 10, a second mask 20, a second connection area 40, a first edge 11, and a second edge 21. The first mask 10 and the second mask 20 are alternately placed in a first direction X1 and they connect to each other. In one exemplary implementation, a portion of the first mask 10 and a portion of the second mask 20 connect to each other.

Although not illustrated, a plurality of openings is formed on the first mask 10 and the second mask 20. An organic light emitting layer and an electrode layer of an organic light emitting element are deposited through the openings.

A second connection area 40 includes a first part and a second part. A portion of the mask 10 and a portion of the second mask 20 overlap each other in the first part. The first mask 10 and the second mask 20 do not overlap each other in the second part. That is, a portion of the first mask 10 and a portion of the second mask 20 overlap each other at a portion of the second connection area 40. The portion of the second connection area 40 extends in a second direction Y1 that is vertical to the first direction X1.

The first part and the second part of the second connection area 40 are alternately placed in the second direction Y1.

The first edge 11 and the second edge 21 are formed at both ends of the mask frame assembly 100 for thin film deposition in the first direction X1, respectively. The first edge 11 is formed at a first end of the mask frame assembly 100 for thin film deposition and the second edge 21 is formed at a second end facing the first end in the first direction X1.

Figure 6:
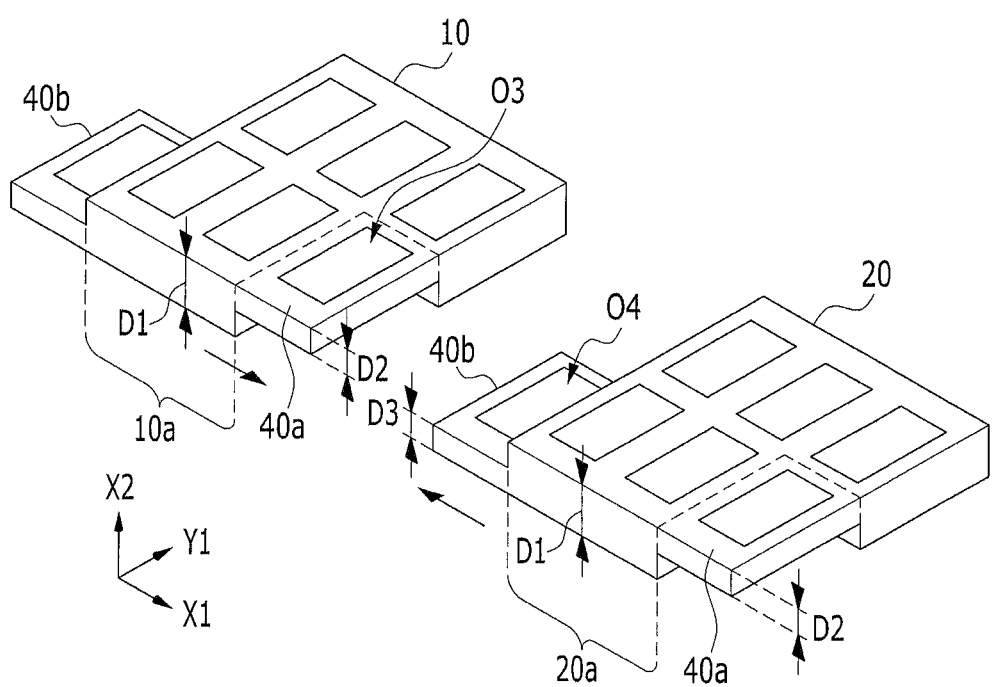
FIG. 6 is a diagram illustrating a part and an assembly method of the mask frame assembly for thin film deposition of FIG. 5.

Then, referring to FIG. 6, structures of the first mask 10 and the second mask 20 of a mask frame assembly 200 for thin film deposition according to the exemplary embodiment of the disclosed technology will be described in detail. FIG. 6 is a diagram illustrating portions and an assembly method of the mask frame assembly for thin film deposition of FIG. 5.

Referring to FIGS. 5 and 6, the first mask 10 includes a first non-overlapped portion 10a having a first thickness D1, a third overlapped portion 40a and a fourth overlapped portion 40b. The third overlapped portion 40a connects to the first non-overlapped portion 10a and has a second thickness D2. The second thickness D2 is less than the first thickness D1 of the first non-overlapped portion 10a. The fourth overlapped portion 40b has a third thickness D3. The third thickness D3 is less than the first thickness D1 of the first non-overlapped portion 10a.

The fourth overlapped portion 40b, the first non-overlapped portion 10a, and the third overlapped portion 40a of the first mask 10 are sequentially formed in the first direction X1.

Each of the third overlapped portion 40a and the fourth overlapped portion 40b of the first mask 10 measured in a second direction Y1 has a length less than the length of the first mask 10 measured in the second direction Y1.

The third overlapped portion 40a of the first mask 10 has the same height of a top surface as the first non-overlapped portion 10a of the first mask 10. That is, the third overlapped portion 40a of the first mask 10 has a shape in which a portion of lower portion of the first mask 10 is removed.

Unlike this, the fourth overlapped portion 40b of the first mask 10 has the same height of a bottom surface as the first non-overlapped portion 10a of the first mask 10. That is, the fourth overlapped portion 40b of the first mask 10 has a shape in which a portion of upper portion of the first mask 10 is removed.

Each of the second thickness D2 of the third overlapped portion 40a and the third thickness D3 of the fourth overlapped portion 40b is less than the first thickness D1 of the first non-overlapped portion 10a. A sum of the second thickness D2 of the third overlapped portion 40a and the third thickness D3 of the fourth overlapped portion 40b may be substantially equal to the first thickness D1 of the first non-overlapped portion 10a. In one exemplary implementation, each of the second thickness D2 of the third overlapped portion 40a and the third thickness D3 of the fourth overlapped portion 40b is approximately one half of the first thickness D1 of the first non-overlapped portion 10a. The second thickness D2 of the first overlapped portion 30a and the third thickness D3 of the second overlapped portion 30b may be substantially equal to or different from each other.

The second mask 20 includes a second non-overlapped portion 20a having the first thickness D1, a third overlapped portion 40a and a fourth overlapped portion 40b. The third overlapped portion 40a connects to the second non-overlapped portion 20a and has the second thickness D2. The second thickness D2 is less than the first thickness D1 of the second non-overlapped portion 20a. The fourth overlapped portion 40b has the third thickness D3. The thickness D3 is less than the first thickness D1 of the first non-overlapped portion 10a.

The third overlapped portion 40a, the second non-overlapped portion 20a, and the fourth overlapped portion 40b of the second mask 20 are sequentially formed in the first direction X1.

The third overlapped portion 40a of the second mask 20 has the same height of a top surface as the second non-overlapped portion 20a of the second mask 20. That is, the third overlapped portion 40a of the second mask 20 has a shape in which a portion of lower portion of the second mask 20 is removed.

Unlike this, the fourth overlapped portion 40b of the second mask 20 has the same height of a bottom surface as the second non-overlapped portion 20a of the second mask 20. That is, the fourth overlapped portion 40b of the second mask 20 has a shape in which a portion of upper portion of the second mask 20 is removed.

Each of the second thickness D2 of the third overlapped portion 40a and the third thickness D3 of the fourth overlapped portion 40b is less than the first thickness D1 of the second non-overlapped portion 20a. A sum of the second thickness D2 of the third overlapped portion 40a and the third thickness D3 of the fourth overlapped portion 40b may be substantially equal to the first thickness D1 of the second non-overlapped portion 20a. In one exemplary implementation, each of the second thickness D2 of the third overlapped portion 40a and the third thickness D3 of the fourth overlapped portion 40b is approximately one half of the first thickness D1 of the second non-overlapped portion 20a. The second thickness D2 of the third overlapped portion 40a and the third thickness D3 of the fourth overlapped portion 40b may be substantially equal to or different from each other.

The first mask 10 and the second mask 20 are placed to be adjacent to each other in the first direction X1 and connect to each other. Referring to FIG. 6, when the first mask 10 and the second mask 20 connect to each other in an arrow direction of FIG. 6, the third overlapped portion 40a of the first mask 10 and the fourth overlapped portion 40b of the second mask 20 overlap with each other. That is, at a portion of the second connection area 40 of FIG. 5, the third overlapped portion 40a of the first mask 10 and the fourth overlapped portion 40b of the second mask 20 overlap with each other.

The third overlapped portion 40a and the fourth overlapped portion 40b are partially formed in the second direction Y1 in which the second connection area 40 is extended.

The widths of the third overlapped portion 40a and the fourth overlapped portion 40b may be greater than the width of the opening O. As a result, the width of the first part 401 of the second connection area 40 may also be greater than the width of the opening O.

A plurality of third openings O3 is formed at the third overlapped portion 40a and a plurality of fourth openings O4 is formed at the fourth overlapped portion 40b. The third openings O3 of the third overlapped portion 40a and the fourth openings O4 of the fourth overlapped portion 40b overlap with each other.

As such, a portion of the second connection area 40 of the mask frame assembly for thin film deposition is formed so that the third overlapped portion 40a and the fourth overlapped portion 40b of the first mask 10 and the second mask 20 connect and overlap with each other. As a result, the mask assembly may not droop depending on a load and the connection area may be prevented from being spaced as compared with the case in which the masks do not overlap with each other at the connection area.

Further, the widths of the third overlapped portion 40a and the fourth overlapped portion 40b may be greater than the width of the opening O. As a result, the width of the first part 401 of the second connection area 40 may also be greater than the width of the opening O to endure a large load. The width of the first part 401 of the second connection area 40 may be changed depending on the load.

The second mask 20 may connect to a left side of the first mask 10. The first mask 10 may connect to a right side of the second mask 20.

As such, in the mask frame assembly for thin film deposition according to the exemplary embodiment of the disclosed technology, the connection area 30 connecting the adjacent masks to each other is formed by making two overlapped portions of two adjacent masks overlap with each other. As a result, an influence by the load is decreased to prevent the connection area from being spaced and the assembly from drooping by the load.

A lot of features of the mask frame assembly for thin film deposition according to the exemplary embodiment described above with reference to FIGS. 1 to 4 may be all applied to the mask frame assembly for thin film deposition according to the exemplary embodiment described with reference to FIGS. 5 and 6.

Various modifications of the above described embodiments will be readily apparent, and the generic principles defined herein are applied to other embodiments without departing from the spirit or scope of the disclosed technology. Thus, the disclosed technology is not intended to be limited to the embodiments shown herein but is to be accorded the widest scope consistent with the principles and novel features disclosed herein.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the disclosed technology have been described with reference to the figures, it will be understood by those of ordinary skill in the art that various changes in form and details may be made therein without departing from the spirit and scope of the disclosed technology as defined by the following claims.

What is claimed is:

1. A mask frame assembly for thin film deposition, comprising:
    a mask frame; and
    a plurality of first masks and a plurality of second masks alternately formed in a first direction and connected to each other, configured to selectively pattern a thin film material on a substrate,
    wherein each first mask includes:
        a first non-overlapped portion having a first thickness,
        a first overlapped portion having a second thickness, and
        a second overlapped portion, the first and second overlapped portions connected to both sides of the first non-overlapped portion,
    wherein each second mask includes:
        a second non-overlapped portion,
        a third overlapped portion, and
        a fourth overlapped portion having a third thickness, the third and fourth overlapped portions connected to both sides of the second non-overlapped portion,
    wherein the first overlapped portion of the first mask and the fourth overlapped portion of the second mask overlap with each other at a connection area, and
    wherein the first thickness is equal to the sum of the second thickness and the third thickness.

2. The assembly of claim 1, wherein
    a plurality of first openings is formed at the first overlapped portion,
    wherein a plurality of second openings is formed at the fourth overlapped portion, and
    wherein the first openings and the second openings overlap each other at the connection area.

3. The assembly of claim 2, wherein
    the width of the connection area measured in the first direction is greater than the width of each of the first openings and the second openings in the first direction.

4. The assembly of claim 1, wherein
    the second overlapped portion of the first mask and the third overlapped portion of the second mask overlap with each other at the connection area.

5. The assembly of claim 1, wherein
    the connection area extends in a second direction that is vertical to the first direction.

6. The assembly of claim 1, further comprising:
    a first edge formed at a first end in the first direction; and
    a second edge portion formed at a second end facing the first edge in the first direction,
    wherein the first edge and the second edge include an overlapped portion formed at the first end and the second end, respectively, and wherein the overlapped portions each have the same thickness as each of the first, second, third and fourth overlapped portions.

7. The assembly of claim 1, wherein
    the connection area includes:
        an overlapping area in which the first overlapped portion of the first mask and the fourth overlapped portion of the second mask overlap each other, and a non-overlapping area in which the first overlapped portion of the first mask and the fourth overlapped portion of the second mask do not overlap with each other.

8. The assembly of claim 7, wherein:
the overlapping area and the non-overlapping area of the connection area are placed alternately to each other in the second direction that is vertical to the first direction.

9. The assembly of claim 7, wherein:
a plurality of first openings is formed at the first overlapped portion,
a plurality of second openings is formed at the fourth overlapped portion, and
the first openings and the second openings overlap with each other at the overlapped portion of the connection area.

10. The assembly of claim 9, wherein
the width of the overlapped portion of the connection area in the first direction is greater than the width of each of the first openings and the second openings measured in the first direction.

\* \* \* \* \*